(12) United States Patent
Li

(10) Patent No.: US 6,948,943 B2
(45) Date of Patent: Sep. 27, 2005

(54) SHUNTING ARRANGEMENTS TO REDUCE HIGH CURRENTS IN GRID ARRAY CONNECTORS

(75) Inventor: Yuan-Liang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/090,796

(22) Filed: Mar. 6, 2002

(65) Prior Publication Data

US 2003/0171011 A1 Sep. 11, 2003

(51) Int. Cl.[7] .................................................. H05K 1/14
(52) U.S. Cl. ............................................ 439/68; 439/65
(58) Field of Search ............................................ 439/65–69

(56) References Cited

U.S. PATENT DOCUMENTS

| | | | |
|---|---|---|---|
| 5,973,928 A | * 10/1999 | Blasi et al. ................. | 361/760 |
| 6,388,207 B1 | * 5/2002 | Figueroa et al. .............. | 174/262 |
| 6,400,576 B1 | * 6/2002 | Davidson .................... | 361/763 |
| 6,495,770 B2 | * 12/2002 | Li et al. ..................... | 174/255 |
| 6,586,684 B2 | * 7/2003 | Frutschy et al. .............. | 439/66 |
| 6,608,259 B1 | * 8/2003 | Norskov ..................... | 174/261 |

* cited by examiner

Primary Examiner—Renee Luebke
(74) Attorney, Agent, or Firm—Schwegman, Lundberg, Woessner & Kluth, P.A.

(57) ABSTRACT

A shunt connector is provided to electrically couple two electrical components mountable together via a grid array. The connector may provide mechanical support and provides a shunt electrical conduction path to increase current-carrying capacity between the electrical components of the grid array. In an embodiment, at least part of the shunt connector may extend within one of the electrical components so as to provide the shunt electrical conduction path.

58 Claims, 6 Drawing Sheets

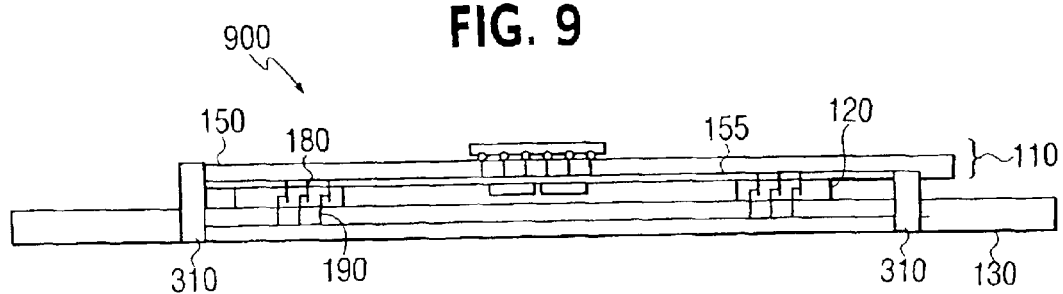
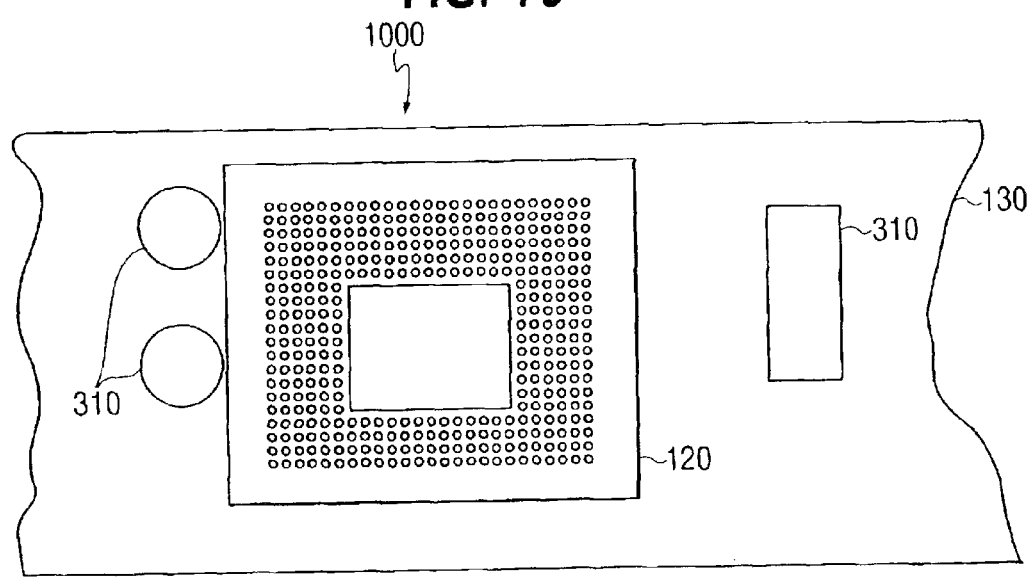

US 6,948,943 B2

SHUNTING ARRANGEMENTS TO REDUCE HIGH CURRENTS IN GRID ARRAY CONNECTORS

FIELD

The inventive subject matter is directed to shunting arrangements to reduce high currents in grid array connectors.

BACKGROUND

Background and example embodiments of the inventive subject matter may be described using the context of processors and semiconductor package grid array mounting arrangements, but it is submitted that practice of the inventive subject matter and a scope of the appended claims are not limited thereto.

Power (e.g., power supply current(s) and grounding current(s); hereinafter, sometimes generically called "power current(s)") requirements for processing systems continue to increase as processor performance capabilities increase. Designing toward more efficient delivery of power current(s) is complicated by the need to meet marketplace demands for smaller-sized devices having the same or greater operating capabilities.

Increasing power current(s) through conduction paths (e.g., pins/sockets, bumps/balls/pads) of present processor package grid arrays (e.g., pin/socket grid arrays, bump/ball grid arrays (BGA), micro BGA ($\mu$BGA)) may result in larger power dissipations, but such may, in turn, lead to appreciable heating of a processor package environment. The addition of heat spreaders and heat sinks to counter the heating and lower the temperatures in the package, adds weight to the system. Further, the use of such conduction paths, e.g., pin/socket, to meet current demands of high speed (e.g., 6 GHz) processors may also result in currents through ones of the pins/sockets to exceed safe pin/socket current limits, perhaps by an unacceptable percentage (e.g., 20%). As requirements and demand for power continue to increase, the situation will worsen. Needed are arrangements to efficiently transfer high currents in grid array mounting arrangements.

BRIEF DESCRIPTION OF THE DRAWINGS

The foregoing and a better understanding of the inventive subject matter will become apparent from the following detailed description of example embodiments and the claims when read in connection with the accompanying drawings, all forming a part of the disclosure of this inventive subject matter. While the foregoing and following written and illustrated disclosure focuses on disclosing example embodiments of the inventive subject matter, it should be clearly understood that the same is by way of illustration and example only and that embodiments of the invention are not limited thereto. Such embodiments of the inventive subject matter may be referred to, individually and/or collectively, herein by the term "invention" merely for convenience and without intending to voluntarily limit the scope of this application to any single invention or inventive concept if more than one is in fact disclosed. The spirit and scope of embodiments of the present invention are limited only by the terms of the appended claims.

The following represents brief descriptions of the drawings, wherein:

FIG. 9 is a side view similar to FIG. 3, but showing alternative shunt locations outside the socket assembly;

FIG. 10 is a top view similar to FIG. 4, but illustrating the example location of the FIG. 9 shunt locations;

DETAILED DESCRIPTION

Figure 1:
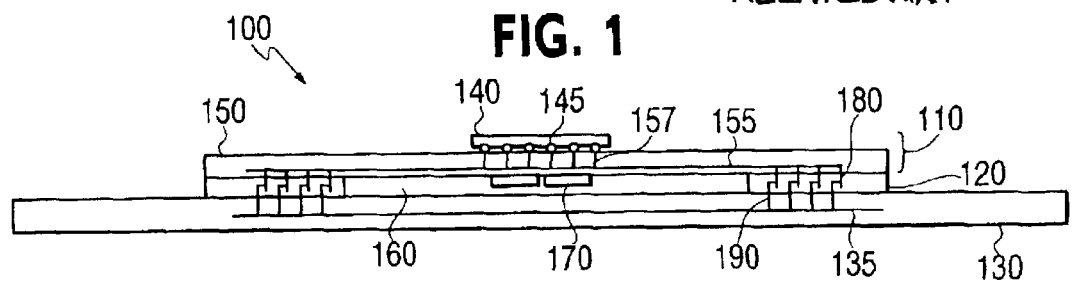
FIG. 1 relates to a side view of an example semiconductor package mounted on a pin/socket arrangement relative to a receiving substrate (i.e., motherboard), such view being useful in explanation and understanding of background and example embodiments of the present invention.

Before beginning a detailed description of the inventive subject matter, mention of the following is in order. When appropriate, like reference numerals and characters may be used to designate identical, corresponding or similar components in differing figure drawings. Further, in the detailed description to follow, example sizes/models/values/ranges may be given, although embodiments of the present invention are not limited to the same. Example arbitrary axes (e.g., X-axis, Y-axis and/or Z-axis) and/or example arbitrary column (C) and row (R) directions may be discussed/illustrated, although practice of embodiments of the present invention is not limited thereto (e.g., differing axes/column/row directions may be able to be assigned). Well-known power/ground connections to ICs and other components may not be shown within the FIGS. for simplicity of illustration and discussion, and so as not to obscure the inventive subject matter. Further, arrangements may be shown in block diagram form in order to further avoid obscuring the inventive subject matter, and also in view of the fact that specifics with respect to implementation of such block diagram arrangements are highly dependent upon the platform within which the inventive subject matter is to be implemented, i.e., such specifics should be well within purview of one skilled in the art. Where specific details (e.g., structures, circuits, flowcharts) are set forth in order to describe example embodiments of the invention, it should be apparent to one skilled in the art that the inventive subject matter can be practiced without, or with variation of, these specific details.

At this is again stressed that the context of the example embodiments described ahead dose not limit practice of the inventive subject matter or a scope of the appended claims.

For example, although example embodiments of the present invention will be described using an example semiconductor package making use of a pin/socket mounting arrangement, practice of the inventive subject matter is not limited thereto, i.e., the inventive subject matter may be able to be practiced with other types of mounting arrangements (e.g., BGA, µBGA). Further, practice may be applicable to non-package arrangements, e.g., to mount a pinned printed circuit board (PCB) such as an interposer board to another receiving substrate. That is, the term "receiving substrate" may be generically used to describe the component (e.g., motherboard) upon which the first component, i.e., an "interfacing substrate" (e.g., semiconductor package, interposer board, PCB) is mounted. Finally, while example embodiments of the present invention will be described using an example semiconductor processor in a computing system environment, practice of the inventive subject matter is not limited thereto, i.e., the inventive subject matter may be able to be practiced with other types of systems, and in other types of environments (e.g., chip sets, graphics chips, and automotive, military and flight communication systems).

Turning now to a detailed description, FIG. 1 illustrates a side view 100 of a semiconductor package 110 mounted via pins or connectors onto a mounting assembly or socket assembly 120 electrically connected (e.g., soldered) to a receiving substrate 130 such as a PCB (e.g., motherboard), such view being useful in explanation and understanding of background and example embodiments of the present invention. The semiconductor package 110 may contain an example processor die 140 and at least one interfacing substrate 150 (e.g., a chip carrier PCB), and typically additionally includes an optional interposer PCB (not shown). The die 140 may be mounted and electrically connected to the interfacing substrate 150 using, for example, a grid array of electrically conductive bumps/balls 145 and a corresponding array of pads/vias 157.

Also illustrated is a reserved component area 160 (e.g., cavity) providing an open volume bounded by the semiconductor package 110, socket assembly 120 and receiving substrate 130 for mounting electrical components (e.g., capacitors 170) therein. Such reserved component area 160 may alternatively be called a land side component (LSC) or a pin side component (PSC) area, and in an advantageous arrangement, a bottom of the semiconductor package 110 may include predefined PCB conductive patterns thereon representing predefined sites where components (e.g., decoupling capacitors) may be conveniently mounted. Remaining components of FIG. 1 will be discussed momentarily.

Figure 2:
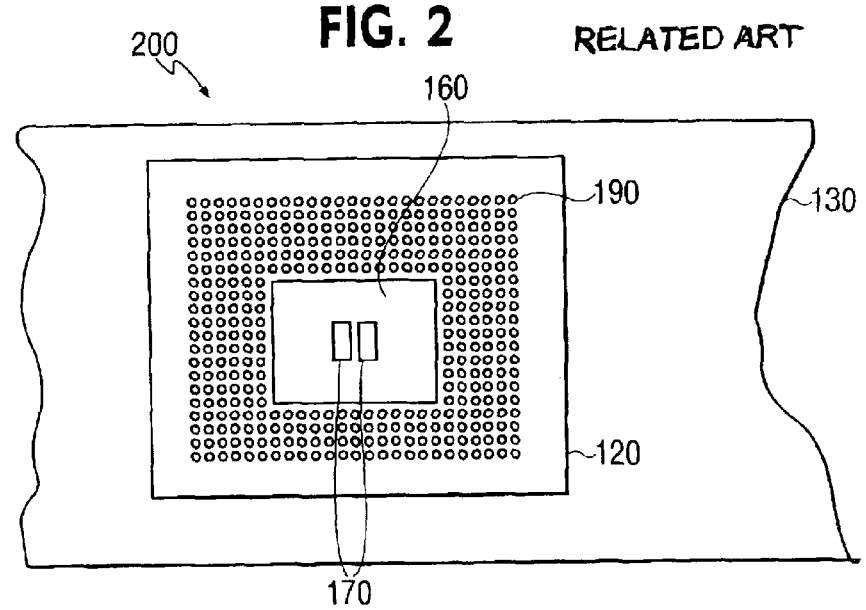
FIG. 2 is a top view of the example FIG. 1 socket and receiving substrate.

Turning next to FIG. 2, there is shown a top view 200 (cut horizontally through the components 170) of the example FIG. 1 socket assembly 120 and receiving substrate 130. More specifically, the top view 200 illustrates a clearer view of the example reserved component area 160 allowing space for the components 170. Also shown is an example location/arrangement of a grid of pin-receiving sockets 190 of the socket assembly 120. Each socket 190 accommodates a pin 180 (see FIG. 1) of a cross-sectional size appropriate to mate with the socket. That is, a grid array of the sockets 190 substantially corresponds to the grid array of the pins 180 of the pinned semiconductor package.

Accordingly, the semiconductor package 110 is electrically connected to the receiving substrate 130 through a predetermined number of grid array electrical connection paths defined by respective pin 180 and socket 190 pairs. Thus, current transfer (electrical conduction) of power, grounding and signals to/from example electrical planes 135 of the receiving substrate 130 in an electrical direction toward the processor die 140 may be accomplished (in part) by the sockets 190 and pins 180. Further transfer to/from the die 140 may be accomplished through example interfacing substrate electrical planes 155 (FIG. 1) in the interfacing substrate 150, and onward to electrically conductive pads/vias 157, and still further to bumps/balls 145.

As the power current(s) demand increases so as to satisfy die 140 functionality in the FIGS. 1 and 2 arrangements, high current may be needed to pass through the pin-receiving sockets 190 and pins 180. Due in part to a small cross-sectional area of each pin 180 and corresponding pin-receiving socket 190, any attempt to pass high current through the pins and sockets may result in appreciable heating thereof. That is, electrical resistance (which contributes to heat generation) is inversely proportional to this cross-sectional area. In the disadvantageous arrangement, heating and a resulting decrease in reliability may be expected, especially in a situation where a number of pin/socket pairs needed for safe power current transfer is greater than a number of pin/socket pairs which can be dedicated to power current transfer.

Any excessive heat must be dissipated to avoid damage, and so as to ensure a long life of the system. Heat spreader and heat sink structures are one example approach for heat dissipation, but such structures add weight and size to the system and thwart device miniaturization. Despite the ability to provide heat-dissipating heat spreaders and heat sinks to provide some heat dissipation, there still may be safety (e.g., melt down) limitation imposed on a maximum current which can be conducted through a pin/socket pair, as not all heat may be able to be conducted away. Any current over such limitation may increase a probability of damage (e.g., melt down, fire). If the disadvantageous arrangement is used in systems attempting to meet anticipated future requirements (e.g., 6 GHz processors), the maximum actual current transfer encountered per pin/socket during system operation may be a sizable percentage (e.g., 20%) over the socket's current limitation. With future power current increases, this situation will only worsen.

As one possible solution to increase a current-carrying capacity of the pin/socket assembly without increasing a resultant heating, the resistance of individual pins and sockets may be lowered. This can be accomplished by an increase in cross-sectional area of existing pins, and corresponding sockets. Such an increase in size, however, requires a rearrangement of existing pin and socket arrays, and in any socket assembly having constraints limiting its overall size, may decrease the number of pins/sockets available for signal transfer. Furthermore, increasing size is not desirable as an industry trend, and demand is toward smaller-sized (miniature) arrangements and components.

As another possible solution, power current(s) can be increased by increasing the number of pins utilized for power transfer, thus lowering total resistance encountered by the power transfer and resulting in lower power dissipation per pin/socket pair. However, the re-dedication of additional existing pins/sockets to power current(s) transfer only results in such pins becoming unavailable for use for other functions, and such unavailability may be unacceptable. Likewise, any attempted addition of further pin/socket pairs may be unacceptable, as again, the industry trend is toward smaller-sized arrangements and components. Further, if individual pin/socket pairs added for power dissipation do not provide a much lower resistance path than the resistance of the original pin/socket pairs, then high current may not necessarily be shunted through the added pin/socket pairs.

As a further disadvantage, any increased density of pins may result in increased and/or excessive noise being induced between closely neighboring pin/socket pairs. Thus, use of additional pin/socket pairs may not acceptably reduce the current and heat flowing through one region of a semiconductor package.

Figure 3:
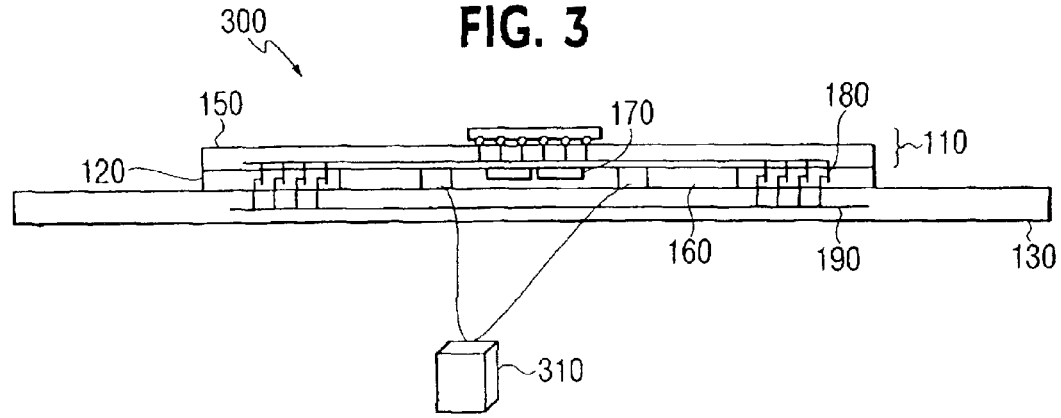
FIG. 3 is a side view similar to FIG. 1, but illustrating an example embodiment of the present invention showing example locations of shunt embodiments inside a reserved component area of a package.

FIG. 3 is a side view similar to FIG. 1, but illustrating an example embodiment of the present invention. More specifically, the side view 300 illustrates example shunt(s) 310 shown both in a perspective view (bottom of the FIG), and in installed positions between the receiving substrate 130 and the semiconductor package 110. The shunt(s) 310 may be of conductive (e.g., metal, conductive polymer) material and may have a variety of shapes (e.g., bars, poles). Such shunt(s) are electrically connected to the receiving substrate and the semiconductor package, and serve as a shunting conduit for power current(s) transfers. Such shunt (s) may be positioned in various locations substantially anywhere in the reserved component area 160, as long as the shunt does not obstruct, is not in direct contact with, or in arcing distance to, any pin/socket pair or any component 170 (e.g., capacitor).

As mentioned previously, a bottom side of the semiconductor package 110 within the reserved component area 160 may include predefined PCB conductive patterns where components (such as decoupling capacitors) may be mounted. In one advantageous arrangement, any available (otherwise unused) pattern(s) may be used as a convenient location and an electrical connection mechanism to provide the shunt(s). As another advantageous arrangement, shunts for power supply and grounding may be positioned in close proximity to each other to achieve a low inductance.

The shunt(s) 310 may have a lower electrical resistance than any pin/socket pairs due in part to the shunt's larger cross-sectional area. The shunt(s) may primarily act as a shunt for direct current (DC), and secondarily for low frequency current that results from a less than 100% conversion of Alternating Current (AC) to Direct Current (DC). The shunt(s) may be formed in any known or future manufacturing process, e.g., a non-exhaustive listing including a mold, stamp, etch, extrude, or deposit process. The shunt(s) may even be made of a lightweight solid or hollow material (e.g., plastic) having a conductive layer coating thereon. The shunt(s) should be capable of withstanding temperatures of at least a normal electrical package operation.

The receiving substrate 130 and the semiconductor package 110 may have conductive patters in the form of power and ground plane, pad, and via locations compatible with the shunt(s). By moving the transfer of large currents from the grid array pin/socket pairs, the occurrence of excess power conduction through the pin/socket pairs is drastically decreased. Use of the shunting embodiments is expected to remove the previously discussed reliability concerns that involve heat, and is expected to lessen a size and weight of any implemented heat spreader or heat sink. The shunting embodiments of the present invention are able to handle anticipated extremely high current needs of future electrical devices.

Figure 4:
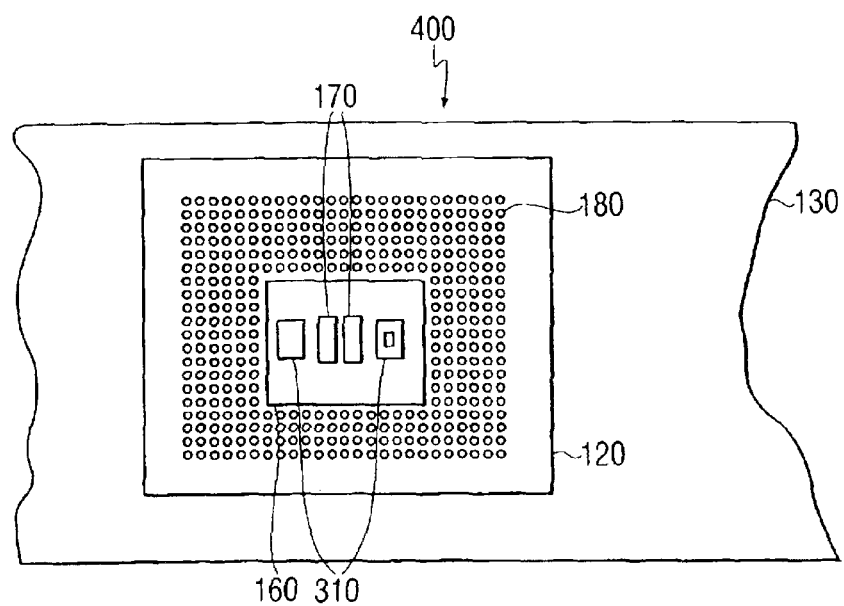
FIG. 4 is similar to FIG. 2, but shows a top view of the FIG. 3 example locations of the shunt embodiments inside the reserved component area.

FIG. 4 is similar to FIG. 2, but shows a top view 400 of the FIG. 3 example locations of the shunt embodiments inside the reserved component area. The shunts may individually serve a grounding, or power transfer, function. The FIGS. 3–4 example embodiment may result in little impact to the existing pin and socket layout, as the shunts are wholly provided within the reserved component area 160.

Figure 5:
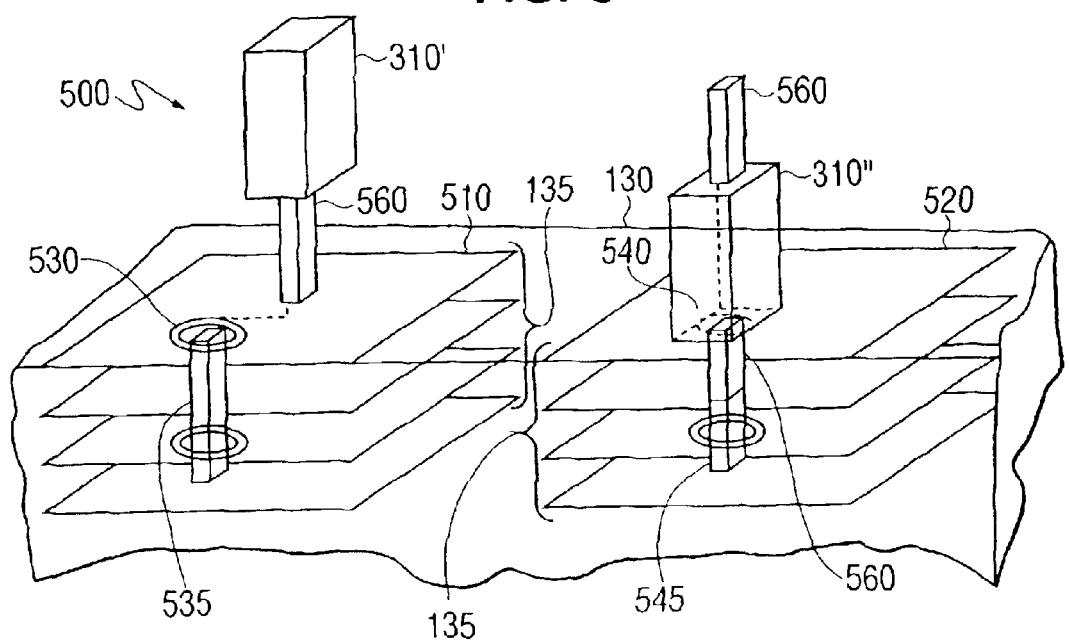
FIG. 5 is a perspective see-through view illustrating example contact footprints of the example FIG. 4 shunt embodiments relative to a receiving substrate's layering arrangement.

FIG. 5 is a perspective see-through view 500 illustrating example contact footprints of the example FIG. 4 shunt embodiment relative to a receiving substrate's layering arrangement. Such electrical planes 135 may be power planes 510 (including power pads 530 and power vias 535), or ground planes 520 (including ground pads 540 and ground vias 545) for transfer of power currents. FIG. 5 also illustrates example contact footprint locations of the shunts 310', 310" onto the power pads 530 and ground pads 540. Potential electrical contact areas between any shunt 310 (FIG. 3) and a conduction path of the interfacing substrate 150, of the receiving substrate 130, and of the socket assembly 120, are referred to herein as a "conductive pattern" and may include, but are not necessarily limited to, a power plane 510 (FIG. 5), a power pad 530, a power via 535, a ground plane 520, a ground pad 540, and a ground via 545. Thus, a shunt 310 (FIG. 3) may be electrically coupled between any of the foregoing types of conductive patterns of an interfacing substrate, of a receiving substrate and/or of a socket assembly.

The respective pads may in turn electrically connect to the power and ground planes of the receiving substrate through the vias. Maximizing the number of vias under each respective power pad 530 or ground pad 540 may aid in lowering the resistance from the receiving substrate electrical planes 135 to the shunt. Such a low resistance DC shunt path helps reduce a maximum current which may flow in any original pin/socket pair which remains connected in parallel with the lower resistance shunt (i.e., the current will prefer the low resistance path). Proper layout and design of shunts, vias and the low resistance path may also be used to control and/or increase a uniformity of current flow within one or both of the receiving substrate (e.g., motherboard) and the interfacing substrate (e.g., package, interposer).

FIG. 5 also illustrates example alternative shunt geometries with extensions 560 (of any possible shape/length) possible on one end (see shunt 310') or both ends (see shunt 310") of the shunt, so as to allow extension into the vias and electrical contact therewith. A shunt 310 without extensions may require soldering at the non-extended ends to mechanically and electrically connect the shunt to a semiconductor package 110 and receiving substrate 130. For example, a non-extended end may be contacted to and/or soldered with the aforementioned predefined PCB conductive patterns. A shunt with extensions at one or both ends may require holes provided within one or both of the interfacing substrate and receiving substrate to accommodate the extensions.

Figure 6:
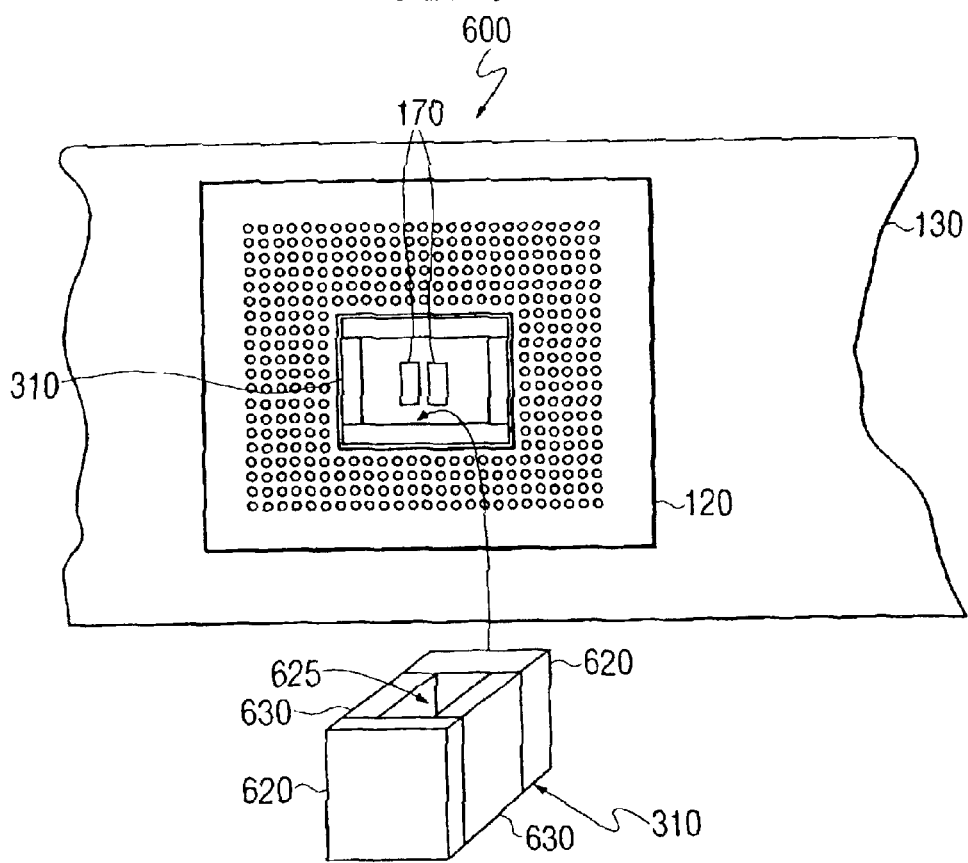
FIG. 6 is a top view similar to FIG. 4, but illustrating an alternative shunt frame structure embodiment.

FIG. 6 is a combined perspective view (bottom of FIG.) and top view 600 illustrating an alternative shunt 310 having a frame-like structure (as opposed to a post-like structure). Such a frame may have open area 625 in a center portion to allow for space for the components 170. If the frame structure is utilized for a singular function (e.g., power transfer), it may be constructed of a single conductive material (e.g. copper) throughout, e.g., as a monolithic frame. In an alternative arrangement, the shunt may have conductive portions 620 separated by insulated portions 630, so that one conductive portion may act as a power supply shunt and the other conductive portion may act as a grounding shunt.

Figure 7:
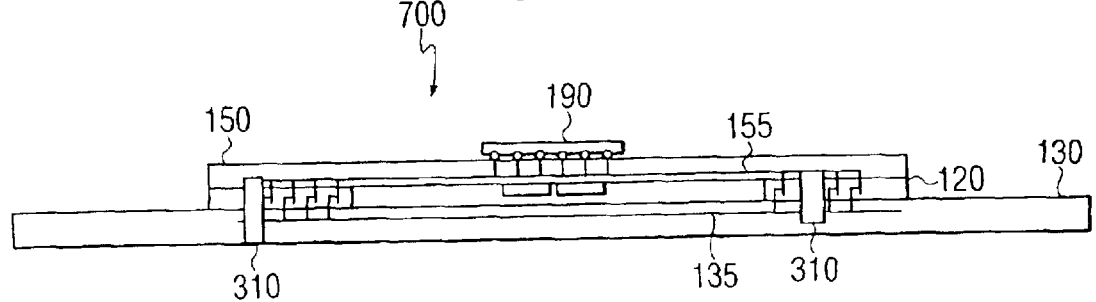
FIG. 7 is a side view similar to FIG. 3, but showing alternative locations for shunts passing through the socket assembly body.

FIG. 7 illustrates another embodiment of the present invention, with the shunts 310 positioned so as to alternatively pass through predefined openings in the socket assembly body 120. Such positioning has an advantage of not requiring an increase in semiconductor package 110 size, and the ability to position the shunts where needed.

Figure 8:
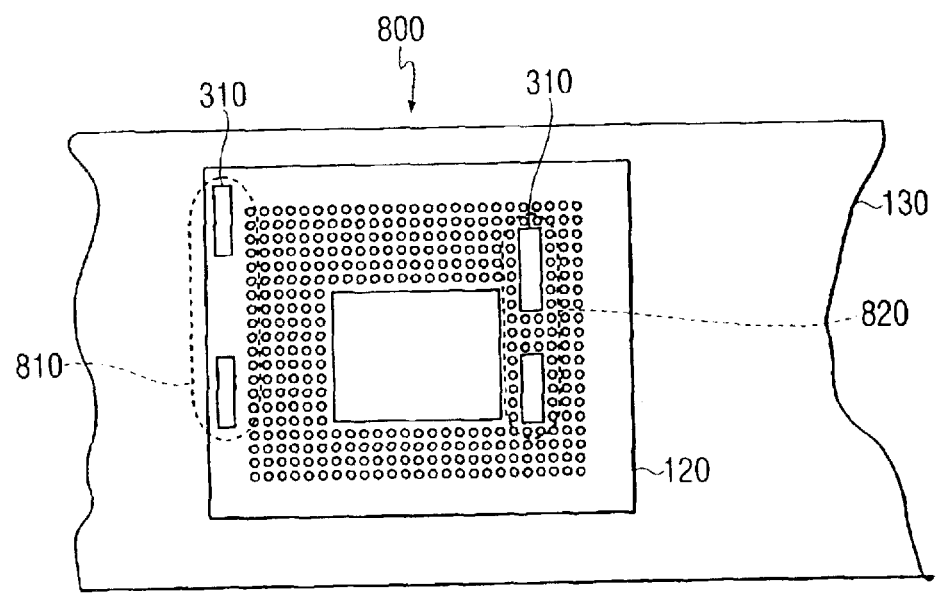
FIG. 8 is a top view similar to FIG. 4, but illustrating a top view of the FIG. 7 example shunt locations.

FIG. 8 is a top view 800 illustrating the FIG. 7 example shunt locations, with the shunts 310 passing through openings in an area 810 outside of pin and socket array area, or passing through an area 820 inside of the pin and socket contacts array area. To accommodate these locations, appropriate modifications may be needed to the receiving substrate, interfacing substrate and/or socket assembly. Again, care must be taken such that each shunt does not obstruct, is not in direct contact with, or in arcing distance to, any pin/socket pair or any other component.

At this point, it is noted that ones or all of the shunts (in any embodiment) may be provided as separate components, or alternatively, ones or all may be provided as integral or monolithic with any of the receiving substrate, interfacing substrate and/or socket assembly.

FIG. 9 is a side view 900 showing alternative locations for shunts 310 in areas outside the socket assembly 120. Such shunts still extend from the receiving substrate 130 to the semiconductor package 110. An advantage of such embodiment is negligible impact to the existing socket assembly 120. Another advantage is that, as power transfer through the shunts is removed in distance from the pins 180 and sockets 190 used for the signal transfer, any noise effects and electromagnetic interference (EMI) effects thereon can be decreased. The size of the semiconductor package 110 may need to be increased, however, to accommodate the interfacing substrate 150 and electrical plane 155 contacting the shunts. Also, additional power and ground pads may be required.

FIG. 10 is a top view 1000 illustrating the example location of the FIG. 9 example shunt embodiments. Further shown in FIG. 10 is the fact that the shunts 310 may vary in shape and size, for example, and may have a cross-sectional area greater than an original pin to accomplish the aforementioned lower resistance. The FIG. 10 shapes and sizes are only examples, and are in no way exhaustive or limiting to possible shapes and sizes.

Figure 11:
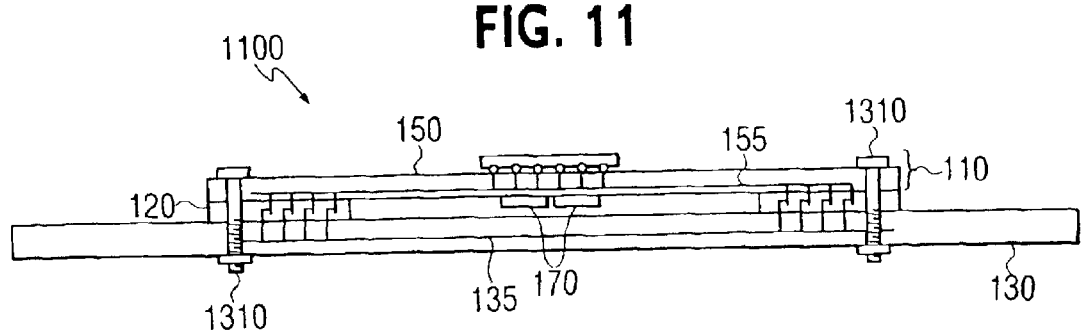
FIG. 11 is a side view similar to FIG. 3, but showing an alternate embodiment of the present invention, where the shunt doubles as a mechanical connector/shunt.

FIG. 11 is a side view 1100 showing an alternate embodiment of the present invention, with the shunt doubling as a mechanical connector for mechanically connecting the semiconductor package 110 to the receiving substrate 130. Such a shunt/connector may, for example, extend through ones or all of the semiconductor package 110, socket assembly 120 and receiving substrate 130. The shunt/mechanical connectors 1310 may be in electrical contact with the interfacing substrate electrical planes 155 and receiving substrate electrical planes 135, and serve the double function of mechanical connection and shunt. Such shunt/mechanical connectors, acting as fasteners, also provide mechanical rigidity to the system. The shunt/mechanical connector may, in an example embodiment, be a bolt or screw, or any other type of mechanical fastener mechanically connecting the semiconductor package 110 to the receiving substrate 130. The connector may also be in contact with respective electrical vias.

Figure 12:
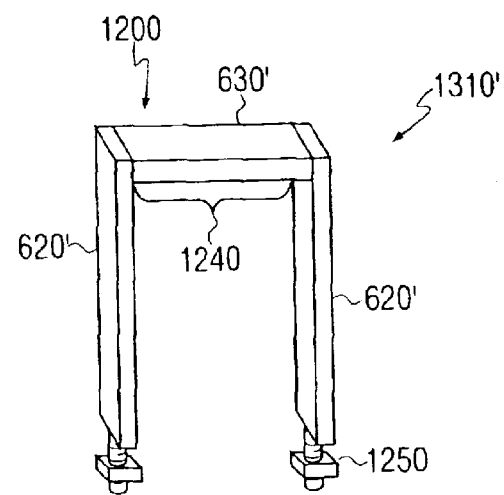
FIG. 12 illustrates an alternative shape for a FIG. 11 connector/shunt.

FIG. 12 has a view 1200 which illustrates an alternative shape/geometry for a shunt/mechanical connector 1310' as a C-shaped clamp. The shunt/mechanical connector 1310' may be of singular (monolithic) conductive material throughout (e.g., to provide only one of power or grounding), or have example conducting portions 620' and insulating portions 630' (e.g., to provide multiple (e.g., parallel) power supply and/or grounding functions). Such FIG. 12 arrangement has an advantage in having a contact portion 1240 of the shunt/mechanical connector in contact with the assembly, or alternatively the interposer, or receiving substrate, or combination thereof. Such contact portion 1240 may provide a larger area for distribution of uniform surface pressure applied through mounting and connection. Alternatively, the shunt/mechanical connector could be shaped as a three- or four-legged table leg structure, providing more than two shunt/mechanical connector legs. The shunt/mechanical connector may be fastened with external fasteners 1250, or in another embodiment the shunt/mechanical connector could be of a screw, rivet, etc., type and could be fastened directly into the motherboard.

The example FIG. 3 through FIG. 12 embodiments may be incorporated in combination with one another (e.g., an embodiment may have an example shunt inside the LSC area, and in addition, have shunt/mechanical connectors which may be on only one side of the semiconductor package/receiving substrate).

In conclusion, reference in the specification to one embodiment, an embodiment, an example embodiment, etc., means that a particular feature, structure or characteristic described in connection with the embodiment is included in at least one embodiment of the invention. The appearances of such phrases in various places in the specification are not necessarily all referring to the same embodiment. Further, when a particular feature, structure or characteristic is described in connection with any embodiment, it is submitted that it is within the purview of one skilled in the art to effect such feature, structure or characteristic in connection with other ones of the embodiments. Furthermore, for ease of understanding, certain method procedures may have been delineated as separate procedures; however, these separately-delineated procedures should not be construed as necessarily order dependent in their performance, i.e., some procedures may be able to be performed in an alternative ordering, simultaneously, etc.

In an embodiment, the inventive subject matter includes a system comprising electrical components mounted together with opposing grid array arrangements having a plurality of grid array connectors, and a shunt/support device including a shunt/support member disposed between and engaged with the electrical components to at least one of mechanically support and secure the electrical components with respect to each other, and further including at least one electrical conduction path electrically connected so as to shunt more than a majority portion of at least one predetermined type of current flowable between the electrical components from flowing through ones of the plurality of grid array connectors.

This concludes the description of the example embodiments. Although the inventive subject matter has been described with reference to a number of illustrative embodiments thereto it should be understood that numerous other modifications and embodiments can be devised by those skilled in the art that will fall within the spirit and scope of the principles of this inventive subject matter. More particularly, reasonable variations and modifications are possible in the component parts and/or arrangements of the subject combination arrangement within the scope of the foregoing disclosure, the drawings and the appended claims without departing from the spirit of the inventive subject matter. In addition to variations and modifications in the component parts and/or arrangements, alternative uses also will be apparent to those skilled in the art. Individual claims may encompass multiple embodiments of the inventive subject matter.

For example, with regard to semiconductor packages, practice of the inventive subject matter is not limited to the above-mentioned pin array, and a non-exhaustive listing of other packages may include a bump/ball grid array. With regard to mechanical connection, the practice of the inventive subject matter is not limited to the FIGS. 11 and 12 connections, and any other fastener object/feature may likewise be provided. For example, a non-exhaustive listing may include welding and glue (e.g., conductive glue). With regard to reduced electrical resistance, a non-exhaustive listing of an alternative approach may include using a shunt material of lower resistance material than a pin/socket material. In addition, the inventive subject matter is not limited to implementation with processor packages, and instead, may be used for shunting in other electrical components.

What is claimed is:

1. A shunt/mechanical connector disposable to directly contact two discrete electrical components mountable together via a grid array comprising a plurality of electrically conductive grid array connectors, the shunt/mechanical connector to provide mechanical support and to provide a shunt electrical conduction path for predetermined electrical current between the electrical components such that the predetermined electrical current does not pass through grid array connectors of the grid array, at least part of said shunt/mechanical connector to extend within one of said electrical components so as to provide the shunt electrical conduction path.

2. A shunt/mechanical connector as claimed in claim 1, where the shunt electrical conduction path has a cross-sectional area greater than that of any one of the grid array connectors, so as to provide a lower resistance shunt path for current than the grid array connectors.

3. A shunt/mechanical connector as claimed in claim 1, where the shunt/mechanical connector has at least one contact to electrically contact at least one of a pad, a via, and predefined conductive patterns electrically connected to a power or ground plane of at least one of the electrical components.

4. A shunt/mechanical connector as claimed in claim 1, where the shunt/mechanical connector is providable in a location in at least one of: a predetermined reserved component area of the grid array arrangements; within a grid array connector area having the plurality of grid array connectors; outside of the grid array connector area, but through any socket assembly providing the plurality of grid array connectors; and, outside of any socket assembly.

5. A shunt/mechanical connector as claimed in claim 1, where the shunt/mechanical connector is substantially made of at least one of rigid electrically conductive sections formed as one of a molded, stamped, etched, extruded and deposited arrangement, and is capable of withstanding temperatures of at least a normal electrical component operation of the electrical components.

6. A shunt/mechanical connector as claimed in claim 1, the shunt/mechanical connector being one of provided separately from, and integrated with one of, the electrical components.

7. A shunt/mechanical connector as claimed in claim 1, where one of the electrical components is one of: a motherboard, a printed circuit board (PCB); and a receiving substrate, and another of the electrical components is one of: a semiconductor package; a semiconductor package having an interposer; and an interfacing substrate.

8. A shunt/mechanical connector as claimed in claim 1, comprising a grid array mount being one of: a bump/ball grid array (BGA); a micro BGA ($\mu$BGA); a pin grid array; and a micro pin grid array.

9. A shunt/mechanical connector as claimed in claim 1, wherein the shunt/mechanical connector is disposable at least partially sandwiched between the electrical components.

10. A mounted electrical components arrangement comprising:
a plurality of discrete electrical components mounted together by a grid array comprising a plurality of electrically conductive grid array connectors, wherein the grid array contacts a first one of the discrete electrical components and a second one of the discrete electrical components; and
a shunt/mechanical connector disposed to directly contact the first one of the electrical components and to directly contact the second one of the electrical components, the shunt/mechanical connector to provide mechanical support and to provide a shunt electrical conduction path for predetermined electrical current such that the predetermined electrical current between the first and second electrical components does not pass through grid array connectors of the grid array.

11. A mounted electrical components arrangement as claimed in claim 10, where the shunt electrical conduction path has a cross-sectional area greater than that of any one of the grid array connectors, so as to provide a lower resistance shunt path for current than the grid array connectors.

12. A mounted electrical components arrangement as claimed in claim 10, where the shunt/mechanical connector has at least one contact in electrical contact with at least one of a pad, a via, and predefined conductive patterns electrically connected to a power or ground plane of at least one of the electrical components.

13. A mounted electrical components arrangement as claimed in claim 10, where the shunt/mechanical connector is provided in a location in at least one of: a predetermined reserved component area of the grid array arrangements; within a grid array connector area having the plurality of grid array connectors; outside of the grid array connector area, but through any socket assembly providing the plurality of grid array connectors; and, outside of any socket assembly.

14. A mounted electrical components arrangement as claimed in claim 10, where the shunt/mechanical connector is substantially made of at least one of rigid electrically conductive sections formed as one of a molded, stamped, etched, extruded and deposited arrangement, and is capable of withstanding temperatures of at least a normal electrical component operation of the electrical components.

15. A mounted electrical components arrangement as claimed in claim 10, the shunt/mechanical connector being one of provided separately from, and integrated with one of, the electrical components.

16. A mounted electrical components arrangement as claimed in claim 10, where one of the electrical components is one of: a motherboard, a printed circuit board (PCB); and a receiving substrate, and another of the electrical components is one of: a semiconductor package; a semiconductor package having an interposer; and an interfacing substrate.

17. A mounted electrical components arrangement as claimed in claim 10, where the grid array mount being one of: a bump/ball grid array (BGA); a micro BGA ($\mu$BGA); a pin grid array; and a micro pin grid array.

18. A mounted electrical components arrangement as claimed in claim 10, wherein the shunt/mechanical connector is disposable at least partially sandwiched between the electrical components.

19. A shunt to directly contact a first discrete electrical component and a second discrete electrical component, said first and second discrete electrical components being mountable together with opposing grid array arrangements having a plurality of grid array connectors, the shunt engageable with the first and second electrical components to at least one of mechanically support and secure the electrical components with respect to each other, and also to provide at least one electrical conduction path electrically connectable so as to shunt more than a majority portion of at least one predetermined type of current flowable between the first and second electrical components, from flowing through ones of the plurality of grid array connectors, at least part of said shunt to extend within one of said first and second electrical components so as to provide the at least one electrical conduction path.

20. A shunt as claimed in claim 19, comprising at least one post between the electrical components.

21. A shunt as claimed in claim 19, the shunt to shunt substantially all of the at least one predetermined type of current.

22. A shunt as claimed in claim 19, the shunt being capable to shunt the more than a majority portion of the at least one predetermined type of current, by the at least one electrical conduction path having a lower electrical resistance for current flowable between the electrical components through the shunt, in comparison to an electrical resistance through the ones of the plurality of grid array connectors.

23. A shunt as claimed in claim 22, with the at least one electrical conduction path having the lower electrical resistance by at least one of: having a current-carrying cross-sectional area measured perpendicularly across an electrical current flow direction therethrough which is greater than a corresponding cross-sectional area of the ones of the plurality of grid array connectors; and being constructed of material which is lower in electrical resistance than an electrical resistance of a material of the ones of the plurality of grid array connectors.

24. A shunt as claimed in claim 19, the at least one predetermined type of current being one of a power supply current, a grounding current, and a high-voltage current.

25. A shunt as claimed in claim 19, the shunt being securable with the electrical components using at least one of solder, welding, at least one fastener, and glue, so as to mechanically secure the electrical components with respect to each other.

26. A shunt as claimed in claim 19, the shunt being disposable in a location in at least one of: a predetermined reserved component area of the grid array arrangements; within a grid array connector area having the plurality of grid array connectors; outside of the grid array connector area, but through any socket assembly providing the plurality of grid array connectors; and, outside of any socket assembly.

27. A shunt as claimed in claims 19, where one of the electrical components is one of: a motherboard, a printed circuit board (PCB); and a receiving substrate, and another of the electrical components is one of: a semiconductor package; a semiconductor package having an interposer; and an interfacing substrate.

28. A shunt as claimed in claim 19, the grid array arrangements being one of: a bump/ball grid array (BGA); a micro BGA ($\mu$BGA); a pin grid array; and a micro pin grid array.

29. A shunt as claimed in claim 19, where the shunt comprises aligner components to substantially align the opposing conductive grid-array patterns of the electrical components during mounting together thereof.

30. A shunt/support device as claimed in claim 19, where the shunt/support member is disposable at least partially sandwiched between the electrical components.

31. A system comprising:
electrical components mounted together with opposing grid array arrangements having a plurality of grid array connectors; and
a shunt/support device including a shunt/support member disposed between and engaged with the electrical components to at least one of mechanically support and secure the electrical components with respect to each other, and further including at least one electrical conduction path electrically connected so as to shunt more than a majority portion of at least one predetermined type of current flowable between the electrical components from flowing through ones of the plurality of grid array connectors, at least part of said shunt/support member to extend within one of said electrical components so as to provide the at least one electrical conduction path.

32. A system as claimed in claim 31, the shunt/support member being at least one shunt/support post disposable between the electrical components.

33. A system as claimed in claim 31, the shunt/support member disposable to shunt substantially all of the at least one predetermined type of current.

34. A system as claimed in claim 31, the shunt/support member being capable to shunt the more than a majority portion of the at least one predetermined type of current by the at least one electrical conduction path having a lower electrical resistance for current flowable between the electrical components through the shunt/support device, in comparison to an electrical resistance through the ones of the plurality of grid array connectors.

35. A system as claimed in claim 31, with the at least one electrical conduction path having the lower electrical resistance by at least one of: having a current-carrying cross-sectional area measured perpendicularly across an electrical current flow direction therethrough which is greater than a corresponding cross-sectional area of the ones of the plurality of grid array connectors; and being constructed of material which is lower in electrical resistance than an electrical resistance of a material of the ones of the plurality of grid array connectors.

36. A system as claimed in claim 31, the at least one predetermined type of current being one of a power supply current, a grounding current, and a high-voltage current.

37. A system as claimed in claim 31, the shunt/support member being securable with the electrical components using at least one of solder, welding, at least one fastener, and glue, so as to mechanically secure the electrical components with respect to each other.

38. A system as claimed in claim 31, the shunt/support device being disposable in a location in at least one of: a predetermined reserved component area of the grid array arrangements; within a grid array connector area having the plurality of grid array connectors; outside of the grid array connector area, but through any socket assembly providing the plurality of grid array connectors; and, outside of any socket assembly.

39. A system as claimed in claim 31, where one of the electrical components is one of: a motherboard, a printed circuit board (PCB); and a receiving substrate, and another of the electrical components is one of: a semiconductor package; a semiconductor package having an interposer; and an interfacing substrate.

40. A system as claimed in claim 31, the grid array arrangements being one of: a bump/ball grid array (BGA); a micro BGA ($\mu$BGA); a pin grid array; and a micro pin grid array.

41. A system as claimed in claims 31, where the shunt/support member comprises aligner components to substantially align the opposing conductive grid-array patterns of the electrical components during mounting together thereof.

42. A system as claimed in claim 31, where the shunt/support member is disposable at least partially sandwiched between the electrical components.

43. An apparatus comprising:
a semiconductor package including a die and a plurality of connectors electrically coupled to the die, wherein the plurality of connectors are formed in an array on a surface of the semiconductor package, and wherein the surface comprises a first plurality of conductive patterns;
a receiving substrate including a mounting assembly to receive the plurality of connectors, wherein the receiving substrate comprises a second plurality of conductive patterns; and
a plurality of shunts electrically and physically coupled between corresponding ones of the first and second plurality of conductive patterns, wherein individual ones of the plurality of shunts have a cross-sectional area and a current-carrying capacity greater than that of any one of the plurality of connectors.

44. The apparatus as claimed in claim 43, wherein the array includes a reserved component area, and wherein the plurality of shunts are within the reserved component area.

45. The apparatus as claimed in claim 43, wherein the array includes a reserved component area, and wherein at least one of the plurality of shunts is within the reserved component area.

46. The apparatus as claimed in claim 43, wherein the array includes a reserved component area, and wherein none of the plurality of shunts are within the reserved component area.

47. The apparatus as claimed in claim 43, wherein the shunts are to conduct power and ground current from the second plurality of conductive patterns on the receiving substrate to the first plurality of conductive patterns on the semiconductor package.

48. The apparatus as claimed in claim 43, wherein at least one of the plurality of shunts is hollow.

49. The apparatus as claimed in claim 43, wherein at least one of the plurality of shunts has a frame-like structure with an open center portion.

50. The apparatus as claimed in claim 43, wherein at least one of the plurality of shunts has a frame-like structure with an open center portion to accommodate components to be mounted therein.

51. The apparatus as claimed in claim 43, wherein at least one of the plurality of shunts includes an extension on one end, and wherein one of the semiconductor package and the receiving substrate has at least one corresponding hole to receive the extension.

52. The apparatus as claimed in claim 43, wherein at least one of the plurality of shunts includes an extension on each end, and wherein the semiconductor package and the receiving substrate have at least one corresponding hole to receive the respective extension.

53. The apparatus as claimed in claim 43, wherein at least one of the plurality of shunts includes at least one conductive portion separated by at least one insulating portion.

54. The apparatus as claimed in claim 43, wherein at least one of the plurality of shunts extends completely through the semiconductor package.

55. The apparatus as claimed in claim 43, wherein at least one of the plurality of shunts extends completely through the semiconductor package and the receiving substrate to fasten the semiconductor package to the receiving substrate.

56. The apparatus as claimed in claim 43, wherein at least one of the plurality of shunts is circular in cross-section.

57. The apparatus as claimed in claim 43, wherein at least one of the plurality of shunts is rectangular in cross-section.

58. The apparatus as claimed in claim 43, wherein the plurality of connectors comprises pins, and wherein the mounting assembly comprises sockets.

* * * * *